United States Patent
Lu et al.

(10) Patent No.: US 10,868,353 B2
(45) Date of Patent: Dec. 15, 2020

(54) ELECTRONIC DEVICE AND MANUFACTURING METHOD THEREOF

(71) Applicant: Taiwan Semiconductor Manufacturing Co., Ltd., Hsinchu (TW)

(72) Inventors: Chun-Lin Lu, Hsinchu (TW); Hsiu-Jen Lin, Hsinchu County (TW); Hsuan-Ting Kuo, Taichung (TW); Kai-Chiang Wu, Hsinchu (TW); Ming-Che Ho, Tainan (TW); Wei-Yu Chen, Taipei (TW); Yu-Peng Tsai, Hsinchu (TW); Chia-Lun Chang, Tainan (TW); Chia-Shen Cheng, Hsinchu County (TW); Chih-Chiang Tsao, Taoyuan (TW); Tzu-Chun Tang, Kaohsiung (TW); Ching-Hua Hsieh, Hsinchu (TW); Tuan-Yu Hung, Changhua County (TW); Cheng-Shiuan Wong, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 22 days.

(21) Appl. No.: 16/387,547

(22) Filed: Apr. 18, 2019

(65) Prior Publication Data
US 2020/0106156 A1 Apr. 2, 2020

Related U.S. Application Data

(60) Provisional application No. 62/737,888, filed on Sep. 27, 2018.

(51) Int. Cl.
*H01L 21/56* (2006.01)
*H01L 23/66* (2006.01)
(Continued)

(52) U.S. Cl.
CPC ......... *H01Q 1/2283* (2013.01); *H01L 21/568* (2013.01); *H01L 23/66* (2013.01);
(Continued)

(58) Field of Classification Search
CPC ....... H01L 2924/00014; H01L 2924/00; H01L 2224/32225; H01L 2924/00012;
(Continued)

(56) References Cited

U.S. PATENT DOCUMENTS 9,000,584 B2 4/2015 Lin et al.
9,048,222 B2 6/2015 Hung et al.
(Continued)

*Primary Examiner* — Wei (Victor) Y Chan
(74) *Attorney, Agent, or Firm* — JCIPRNET

(57) ABSTRACT

An electronic device and a manufacturing method thereof are provided. The electronic device includes a chip package, an antenna pattern, and an insulating layer. The chip package includes a semiconductor die and an insulating encapsulation enclosing the semiconductor die. The antenna pattern is electrically coupled to the chip package, where a material of the antenna pattern comprises a conductive powder having fused metal particles. The insulating layer disposed between the chip package and the antenna pattern, where the antenna pattern includes a first surface in contact with the insulating layer, and a second surface opposite to the first surface, and a surface roughness of the second surface is greater than a surface roughness of the first surface.

9 Claims, 21 Drawing Sheets

(51) Int. Cl.
 *H01L 23/00* (2006.01)
 *H01Q 1/38* (2006.01)
 *H01Q 1/22* (2006.01)

(52) U.S. Cl.
 CPC .............. *H01L 24/05* (2013.01); *H01L 24/13* (2013.01); *H01L 24/24* (2013.01); *H01Q 1/38* (2013.01); *H01L 2223/6677* (2013.01); *H01L 2224/02379* (2013.01); *H01L 2224/02381* (2013.01); *H01L 2224/05569* (2013.01); *H01L 2224/13024* (2013.01); *H01L 2224/24137* (2013.01)

(58) Field of Classification Search
 CPC ..... H01L 2924/181; H01L 2224/73265; H01L 2224/97; H01L 2224/73204; H01L 2224/48227; H01L 2224/48091; H01L 2224/16225; H01L 2223/6677; H01L 23/3128; H01L 23/5389; H01L 2924/15311

USPC ................. 257/E21.502, 531, 532, 660, 678
See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2006/0092079 A1* | 5/2006 | de Rochemont .... H01Q 15/006 343/700 MS |

* cited by examiner

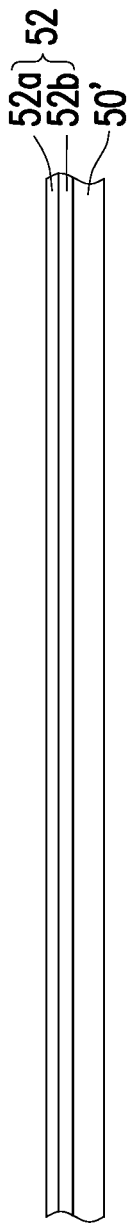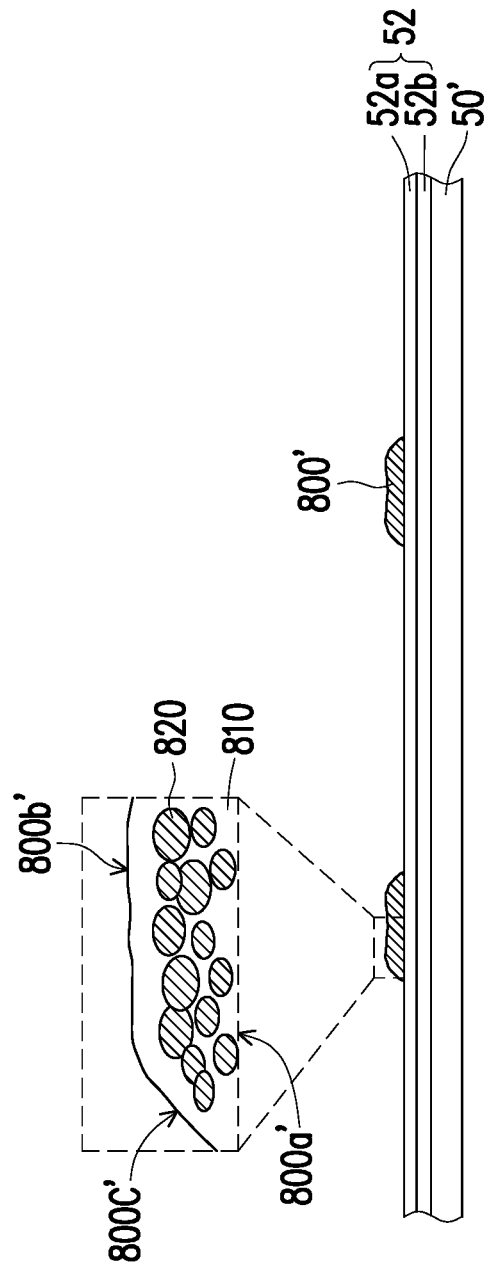

ELECTRONIC DEVICE AND MANUFACTURING METHOD THEREOF

CROSS-REFERENCE TO RELATED APPLICATION

This application claims the priority benefit of U.S. provisional application Ser. No. 62/737,888, filed on Sep. 27, 2018. The entirety of the above-mentioned patent application is hereby incorporated by reference herein and made a part of this specification.

BACKGROUND

Semiconductor devices and integrated circuits are used in a variety of electronic applications, such as personal computers, cell phones, digital cameras, and other electronic devices. As the demand for shrinking electronic devices has grown, a need for smaller and more creative packaging techniques of semiconductor devices has emerged. Thus, packages such as wafer-level packaging (WLP) have begun to be developed. For example, the dies of the wafer may be processed and packaged with other semiconductor devices (e.g. antenna) at the wafer-level. In addition, since the demand of modern communication for more bandwidth, high performance package designs with integrated antenna are desired.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10A to FIG. 10D are schematic cross-sectional views of various stages in a manufacturing method of an antenna pattern and an insulating layer in accordance with some embodiments of the disclosure.

DETAILED DESCRIPTION

Figure 1A:
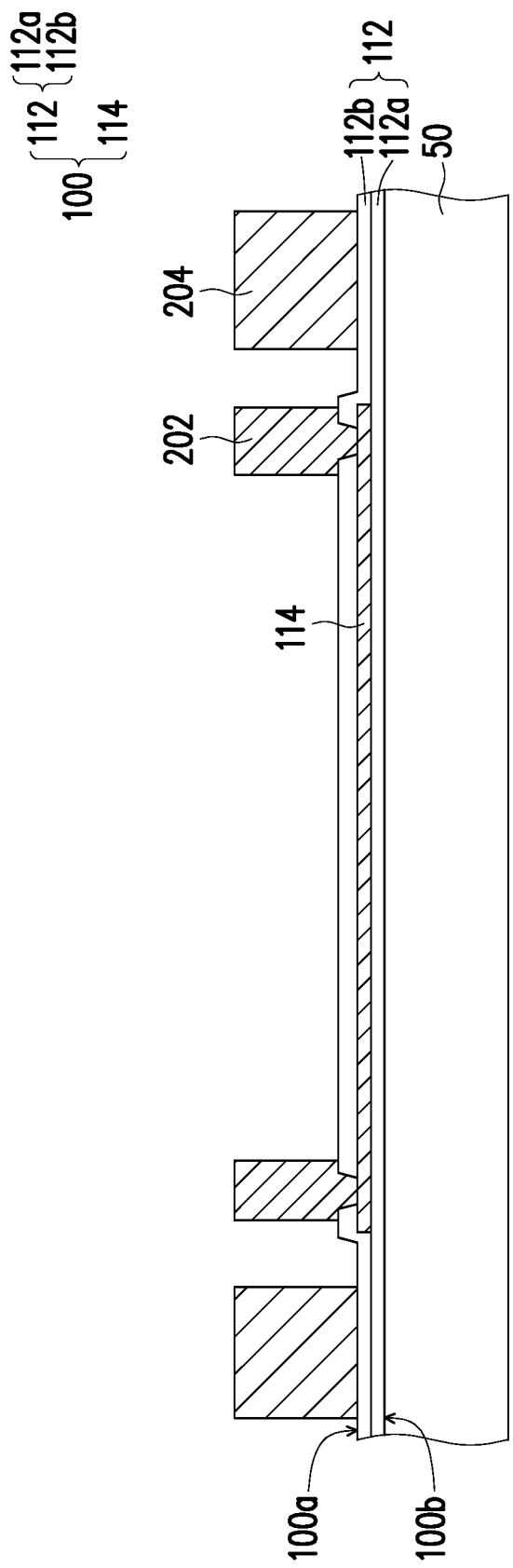
FIG. 1A to FIG. 1H are schematic cross-sectional views of various stages in a manufacturing method of an electronic device in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic cross-sectional views of various stages in a manufacturing method of an electronic device in accordance with some embodiments of the disclosure. Referring to FIG. 1A, in some embodiments, a first redistribution structure 100 is formed over a temporary carrier 50. In some embodiments, a de-bonding layer (not shown) may be provided on the temporary carrier 50, and the first redistribution structure 100 may be formed on the de-bonding layer. For example, the de-bonding layer is a light-to-heat conversion (LTHC) release layer which can aid the removal of the temporary carrier 50 in the subsequent processes. The temporary carrier 50 may include any suitable material that can provide structural support during semiconductor processing. For example, a material of the temporary carrier 50 includes metal, glass, ceramic, silicon, combinations thereof, multi-layers thereof, or the like.

In some embodiments, the first redistribution structure 100 has a first surface 100a and a second surface 100b opposite to the first surface 100a. At this stage, the first surface 100a faces upwardly for processing, and the second surface 100b is attached to the temporary carrier 50. For example, the first redistribution structure 100 includes a dielectric layer 112a, a first patterned conductive layer 114, and a dielectric layer 112b sequentially formed on the temporary carrier 50. In some embodiments, the dielectric layers 112a and 112b are made of the same material, so the dielectric layers 112a and 112b can be collectively referred to as the first dielectric layer 112. In some embodiments, the first dielectric layer 112 may be a polymer layer made of polybenzoxazole (PBO), polyimide (PI), benzocyclobutene (BCB), a combination thereof, or the like. In some embodiments, the first patterned conductive layer 114 formed on the dielectric layer 112a may include feed lines and a ground plane (not shown). For example, the feed lines of the first patterned conductive layer 114 may be electrically connected to other subsequently formed conductive elements for signal transmission, and the ground plane of the first patterned conductive layer 114 may be electrically connected to a ground. A material of the first patterned conductive layer 114 may include copper, nickel, titanium, a combination thereof, or the like. It should be noted that the numbers of the dielectric layers and/or the patterned conductive layer(s) are not limited by the illustration presented in FIG. 1A. In some embodiments, more dielectric layers and/or more patterned conductive layers may be formed and stacked alternately to form the first redistribution structure.

Continue to FIG. 1A, one or more first through interlayer vias (TIVs) 202 and one or more second TIVs 204 may be formed over the first redistribution structure 100 to electrically couple to the first patterned conductive layer 114. It should be noted that the numbers of the first TIVs 202 and the second TIVs 204 are not limited by the illustration presented in FIG. 1A. In some embodiments, the method of forming the first TIV 202 includes the following steps. After forming the dielectric layer 112b with a plurality of openings exposing at least a portion of the first patterned conductive layer 114, a seed material (not shown) may be formed over the patterned dielectric layer 112b and over the first patterned conductive layer 114 exposed by the openings of the patterned dielectric layer 112b. The seed material includes a titanium/copper composite layer, and is formed by, for example, a sputtering process, or other suitable methods. Thereafter, a photoresist layer (not shown) with openings is formed on the seed material, and the openings of the photoresist layer expose the intended locations for the subsequently formed TIVs. Afterwards, a plating process may be performed to form a metallic layer (e.g., a copper layer) on the seed material exposed by the openings of the photoresist layer. The photoresist layer and the underlying seed material are then removed to form the first TIVs 202.

In some embodiments, the second TIVs 204 may be formed by the foregoing steps along with the first TIVs 202 to electrically couple to the first redistribution structure 100. In some alternative embodiments, the second TIVs 204 may be formed by pick and place pre-fabricated TIVs onto the first patterned dielectric layer 112. In some embodiments, the second TIVs 204 are arranged to form a plurality of dipole antennas. For example, each dipole antenna includes dipole arms which may be bilaterally symmetrical conductive elements. In some embodiments, each of the dipole antennas has two L-shaped dipole arms in a top view. As illustrated in FIG. 1A, the second TIVs 204 have a dimension (e.g. width) greater than that of the first TIVs 202. In some alternative embodiments, the second TIVs 204 may have a dimension (e.g. width) substantially equal to or less than that of the first TIVs 202. The first TIVs 202 may be cylindrical in form or pillars having different polygonal cross-sectional shape. However, the shapes of the first TIVs 202 and the second TIVs 204 construe no limitation in the disclosure. The first TIVs 202 may be disposed between the second TIVs 204 and the subsequently-disposed semiconductor die (as shown in FIG. 1C). In some alternative embodiments, the second TIVs 204 can be omitted. The formation of the second TIVs 204 may be optional depending on the product requirements.

Figure 1B:
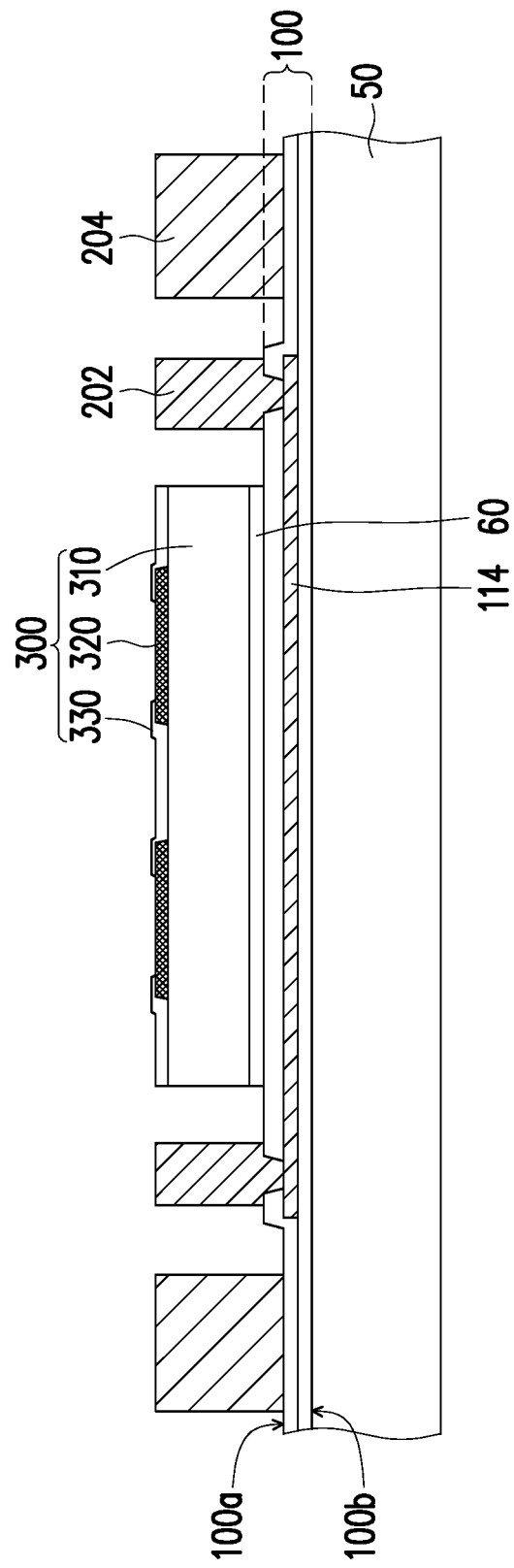
Figure 1C:
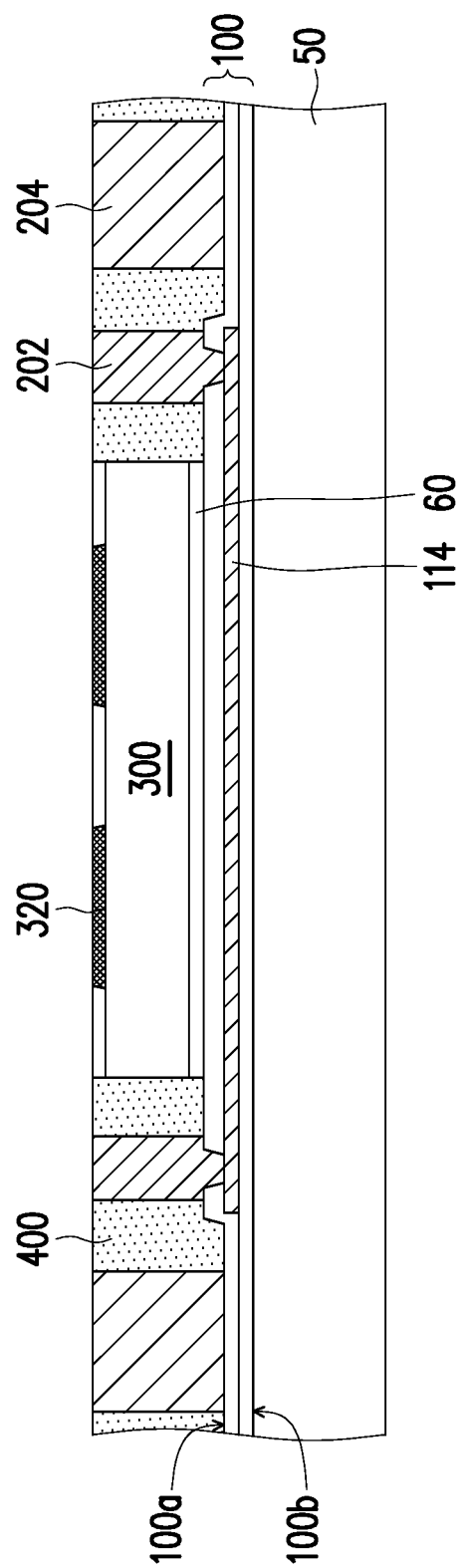

Referring to FIG. 1B, a semiconductor die 300 (or integrated circuit components) may be picked and placed onto the first surface 100a of the first redistribution structure 100. In some embodiments, one or more semiconductor die(s) 300 may be disposed on the first redistribution structure 100 after the formation of the first TIVs 202 and/or the second TIVs 204. In some alternative embodiments, one or more semiconductor die(s) 300 may be picked and placed onto the first patterned dielectric layer 112 before the formation of the first TIVs 202 and/or the second TIVs 204. The semiconductor die 300 may further include additional die/chip(s) of the same type or different types. For example, the semiconductor die 300 includes at least one wireless and radio frequency (RF) die.

In some embodiments, the semiconductor die 300 includes a semiconductor substrate 310, a plurality of conductive pads 320, and a passivation layer 330. In some embodiments, the conductive pads 320 are disposed on an active surface of the semiconductor substrate 310. The passivation layer 330 is formed over the semiconductor substrate 310 and includes contact openings 330a that partially expose the conductive pads 320. The semiconductor substrate 310 may be a silicon substrate including active components (e.g., transistors, or the like) and passive components (e.g., resistors, capacitors, inductors, or the like) formed therein. The conductive pads 320 may be aluminum pads, copper pads, or other suitable metallic pads. The passivation layer 330 may include stacked multi-sublayers, including a silicon oxide layer, a silicon nitride layer, a PI layer, a PBO layer, or a dielectric layer formed by other suitable polymers. In some embodiments, the semiconductor die 300 may be provided with a die attach film 60 adhered to a rear surface of the semiconductor die 300 that is opposite to the active surface. After disposing the semiconductor die 300, the semiconductor die 300 is attached to the first surface 100a of the first redistribution structure 100 through the die attach film 60.

Referring to FIG. 1C, an insulating encapsulation 400 is formed over the first surface 100a of the first redistribution structure 100 to wrap around the semiconductor die 300, the first TIVs 202, and the second TIVs 204. In some embodiments, the semiconductor die 300, the first TIVs 202, and the second TIVs 204 are over-molded and embedded in the insulating encapsulation 400, and an etching process or a polishing process is performed to partially remove the insulating encapsulation 400 to accessibly expose at least the conductive pads 320 of the semiconductor die 300, the top surfaces of the first TIVs 202, and the top surfaces second TIVs 204 for further electrical connection. The insulating encapsulation 400 may include a molding compound, a molding underfill, an epoxy resin, or the like, and may be formed by a molding process.

Figure 1D:
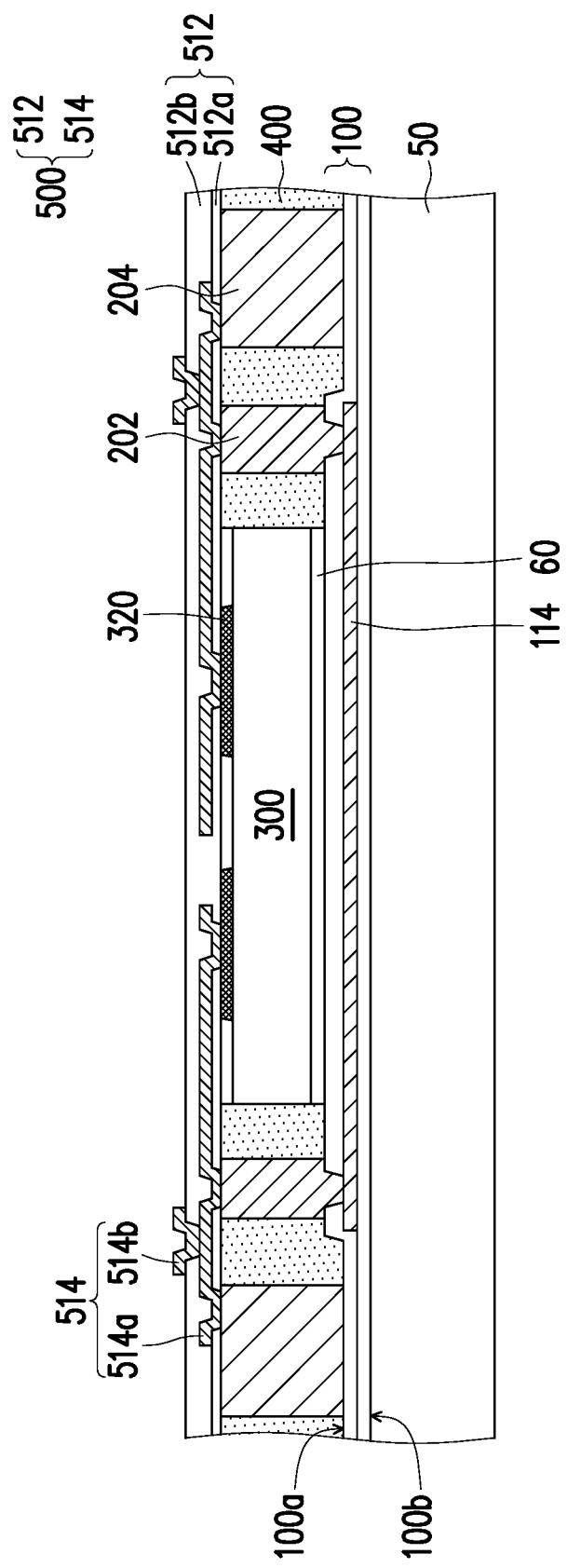

Referring to FIG. 1D, a second redistribution structure 500 is formed on the semiconductor die 300, the first TIVs 202, the second TIVs 204, and the insulating encapsulation 400. In some embodiments, the second redistribution structure 500 includes a second dielectric layer 512, a second patterned conductive layer 514. In some embodiments, the second dielectric layer 512 may include more than one patterned dielectric layers (e.g., 512a and 512b). In some embodiments, the second patterned conductive layer 514 may include more than one patterned conductive layers (e.g., 514a and 514b). A material of the second dielectric layer 512 and a material of the second patterned conductive layer 514 may be similar to that of the first dielectric layer 112 and that of the first patterned conductive layer 114, respectively, so the detailed description thereof is omitted herein.

In some embodiments, the second redistribution structure 500 may be formed using at least the following steps. For example, first, the patterned dielectric layer 512a having a plurality of openings is formed over the semiconductor die 300, the first TIVs 202, the second TIVs 204, and the insulating encapsulation 400, and the patterned dielectric layer 512a includes openings exposing portions of the semiconductor die 300, the first TIVs 202 and the second TIVs 204. Next, the patterned conductive layer 514a is formed on the patterned dielectric layer 512a and in the openings of the patterned dielectric layer 512a to be in physical contact with the conductive pads 320 of the semiconductor die 300, the first TIVs 202, and the second TIVs 204. Next, the patterned dielectric layer 512b is formed over the patterned dielectric layer 512a to cover the patterned conductive layer 514a, and the patterned dielectric layer 512b may have a plurality of openings exposing at least a portion of patterned conductive layer 514a. Subsequently, the patterned conductive layer 514b is formed on the patterned dielectric layer 512b and in the openings of the patterned dielectric layer 512b to be in physical contact with the patterned conductive layer 514a exposed through the patterned dielectric layer 512b. In some embodiments, a portion of the patterned conductive layer 514b may be referred to as under-ball metallurgy (UBM) pattern for the subsequent ball-mounting process. In some alternative embodiments, the patterned conductive layer 514b may include connection pads (not shown) for bonding electronic components (e.g., capacitors, resistors, inductors, etc.).

Continue to FIG. 1D, given the placements in the structure, the first redistribution structure 100 may be referred to as a backside redistribution structure and the second redistribution structure 500 may be referred to as a front side redistribution structure. In some embodiments, since the first redistribution structure 100 and the second redistribution structure 500 reroute the electrical signal of the semiconductor die 300 and reroute outside the span of the semiconductor die 300, the first redistribution structure 100 and the second redistribution structure 500 may be referred to as fan-out redistribution structures. In some embodiments, the signal output from the semiconductor die 300 may be transmitted through portions of the second patterned conductive layer 514, the first TIVs 202, and the first patterned conductive layer 114 in sequential order, and the portions of the second patterned conductive layer 514, the first TIVs 202, and the first patterned conductive layer 114 may be collectively referred to as a feed line. In some embodiments, the second TIVs 204 electrically connected to the second patterned conductive layer 514 of the second redistribution structure 500 may be not in physical contact with the first patterned conductive layer 114 of the first redistribution structure 100.

Figure 1E:
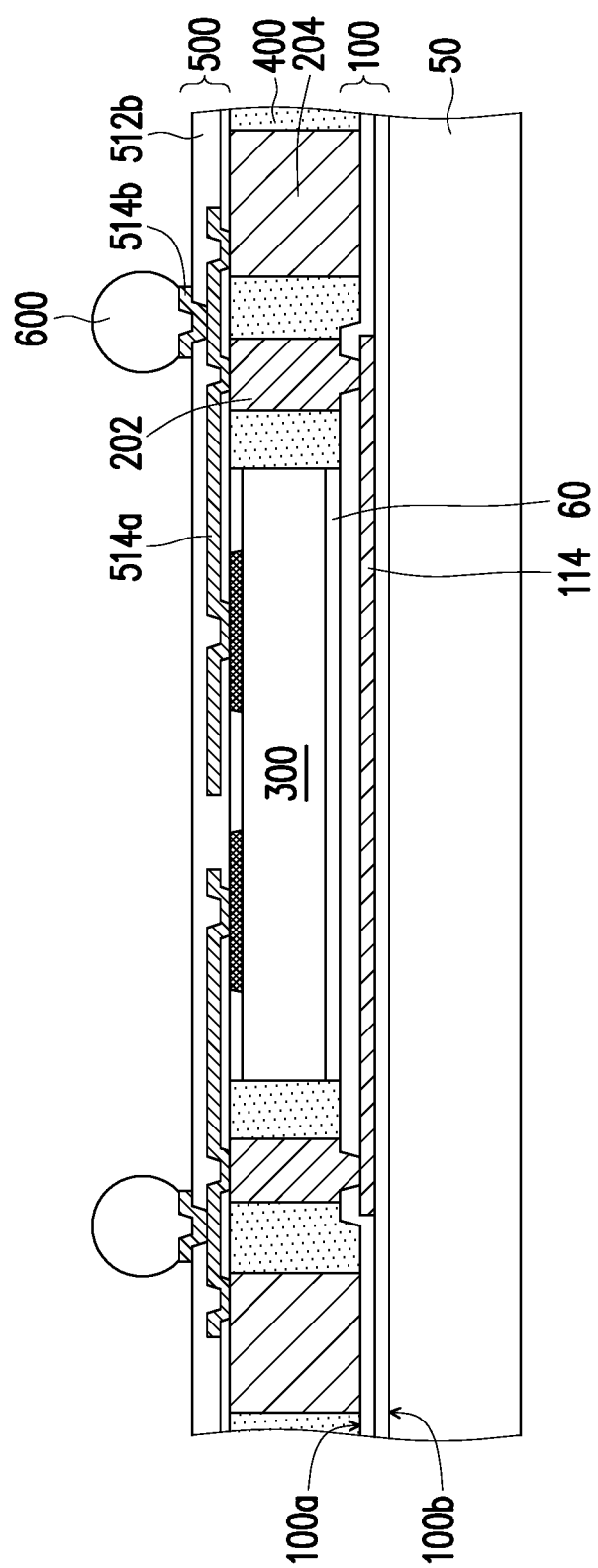

Referring to FIG. 1E, one or more conductive terminals 600 may be formed on patterned conductive layer 514b exposed by the patterned dielectric layer 512b to electrically connect the semiconductor die 300 through the second redistribution structure 500. In some embodiments, the conductive terminals 600 are made of a conductive material with low resistivity, such as Sn, Pb, Ag, Cu, Ni, Bi, or an alloy thereof. The conductive terminal 600 may be solder balls, ball grid array (BGA) balls, or other suitable conductive materials formed in other shapes. For example, the conductive terminal 600 may be disposed on the UBM pattern of the patterned conductive layer 514b by a ball placement process and/or a reflow process. It should be noted that the number of the conductive terminal 600 is not limited by the illustration presented in FIG. 1E.

Figure 1F:
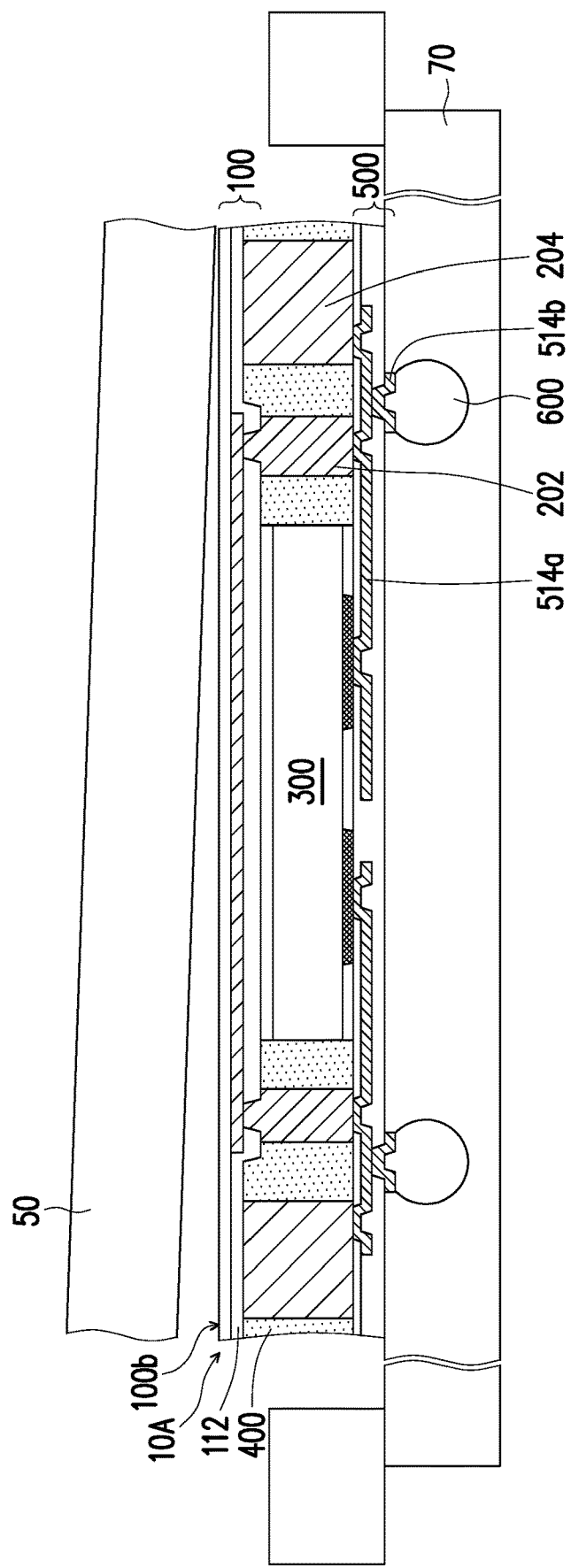

Referring to FIG. 1F, after the conductive terminals 600 are formed, the temporary carrier 50 may be separated from the second surface 100b of the first redistribution structure 100 and then removed. In some embodiments, the temporary carrier 50 is de-bonded from the first patterned dielectric layer 112 of the first redistribution structure 100 by irradiating the de-bonding layer disposed between the temporary carrier 50 and the first redistribution structure 100 with UV or laser. Up to here, the manufacture of a chip package 10A is completed. In some embodiments, the chip package 10A may be referred to as an integrated fan-out (InFO) package. In some embodiments, the chip package 10A can be overturned (e.g., flipped upside down) and disposed on a tape 70 for further processing as illustrated in FIG. 1F.

Figure 1G:
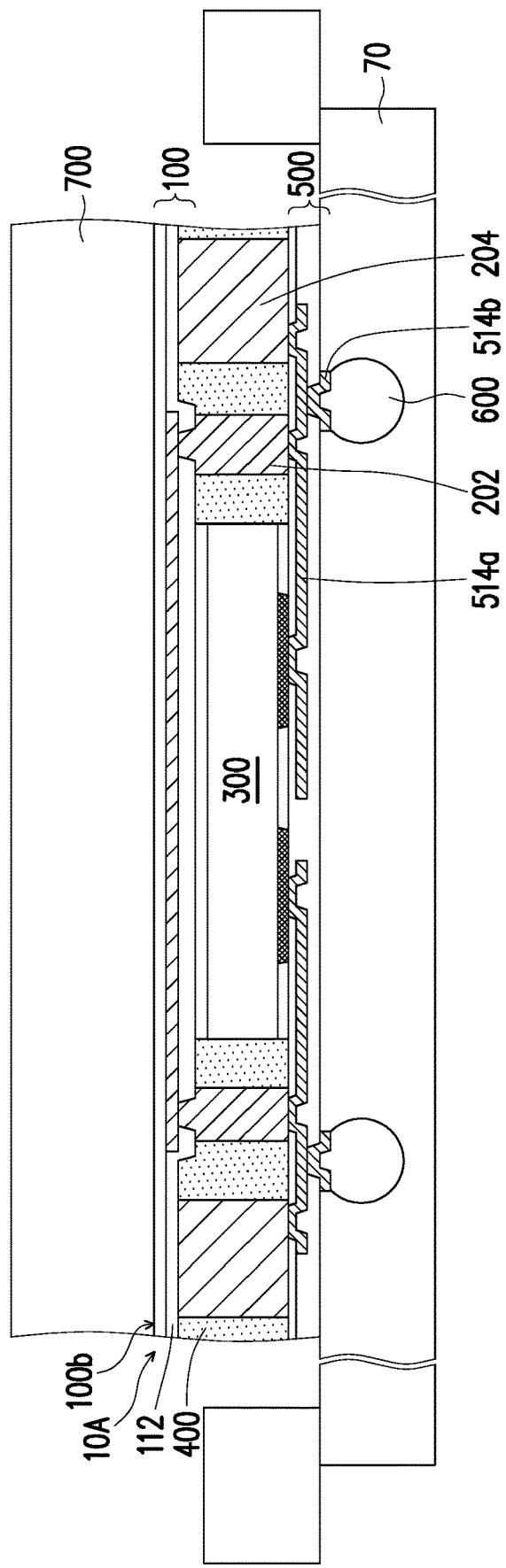

Referring to FIG. 1G, after forming the chip package 10A, an insulating layer 700 is provided. In some embodiments, the insulating layer 700 is laminated onto the second surface 100b of the first redistribution structure 100 of the chip package 10A. In some embodiments, the insulating layer 700 is made of one or more low dissipation factor (Df) and/or low permittivity (Dk) materials. In some embodiments, the insulating layer 700 includes a polymer layer. For example, the insulating layer 700 includes a photo-sensitive material, such as PBO, PI, BCB, a combination thereof, or the like. In some embodiments, the insulating layer 700 may be formed by a suitable fabrication technique such as spin-coating, lamination, deposition, or the like. In some embodiments, the insulating layer 700 includes epoxy resins, or any suitable type of molding materials. Depending on the frequency range of high-speed applications, suitable materials of the insulating layer 700 may be selected based on the required electrical properties of the electronic device.

Figure 1H:
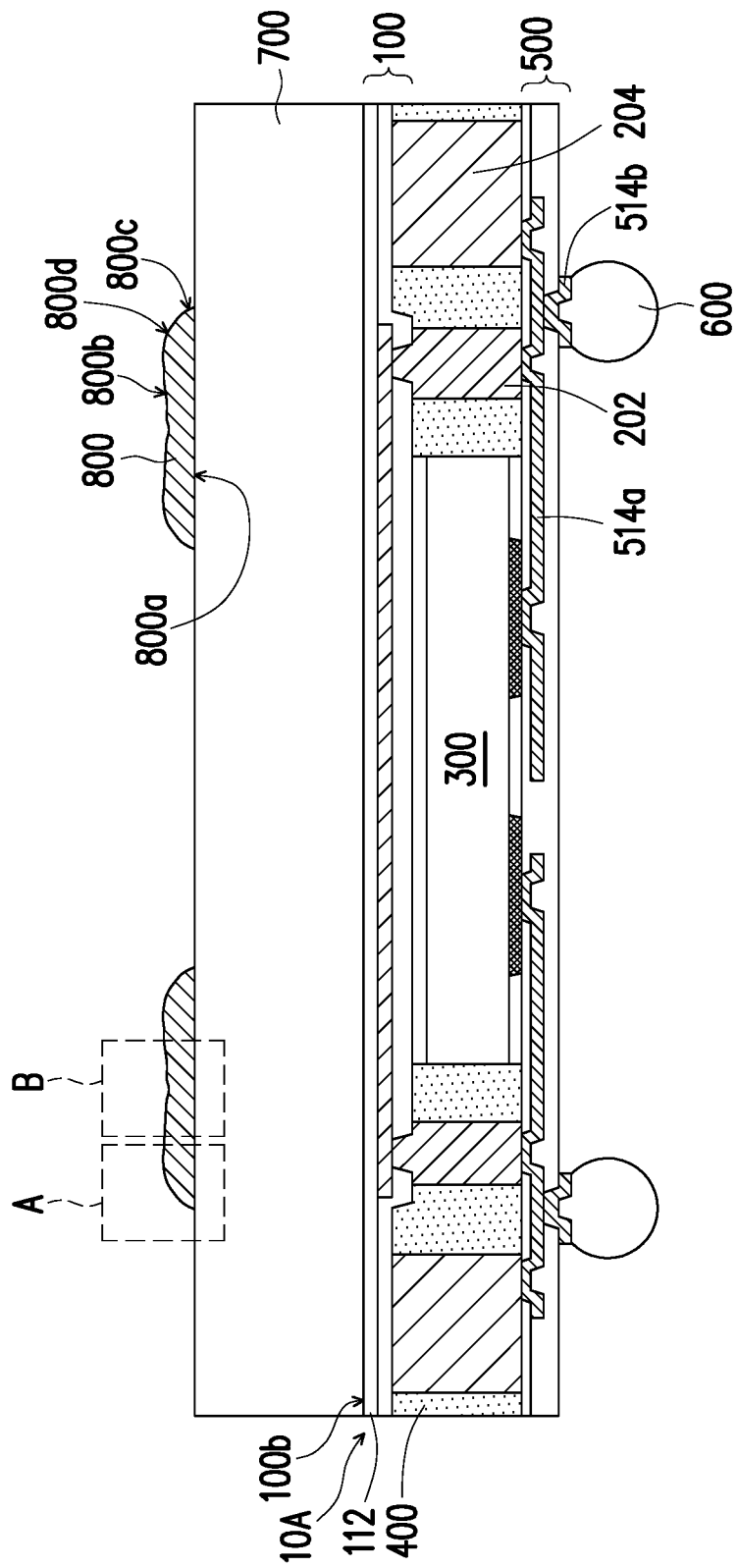
Figure 2A:
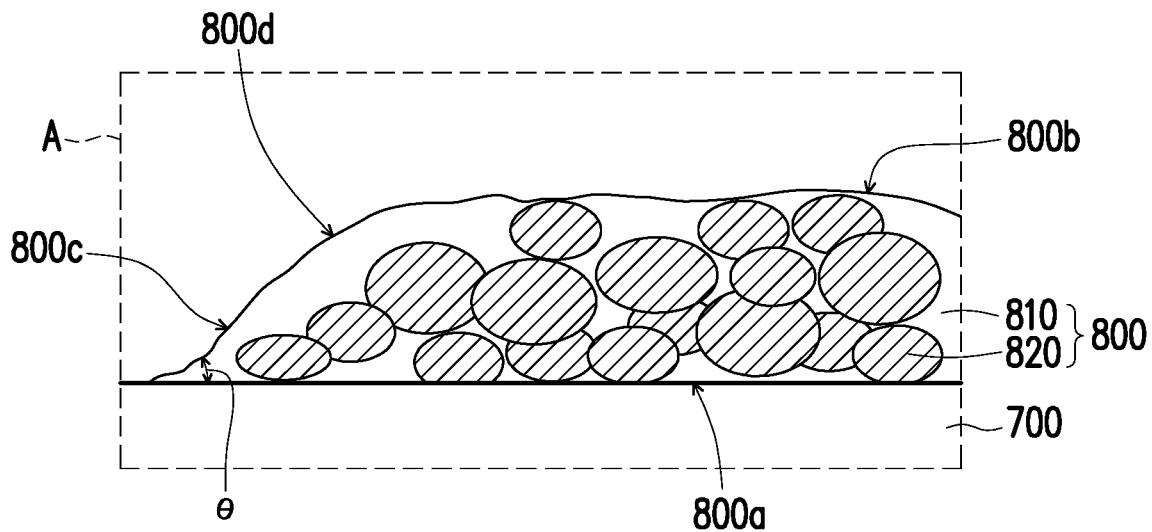
FIG. 2A and FIG. 2B are enlarged, schematic cross-sectional views of the dashed box A and the dashed box B respectively depicted in FIG. 1H according to some exemplary embodiments of the disclosure.
Figure 2B:
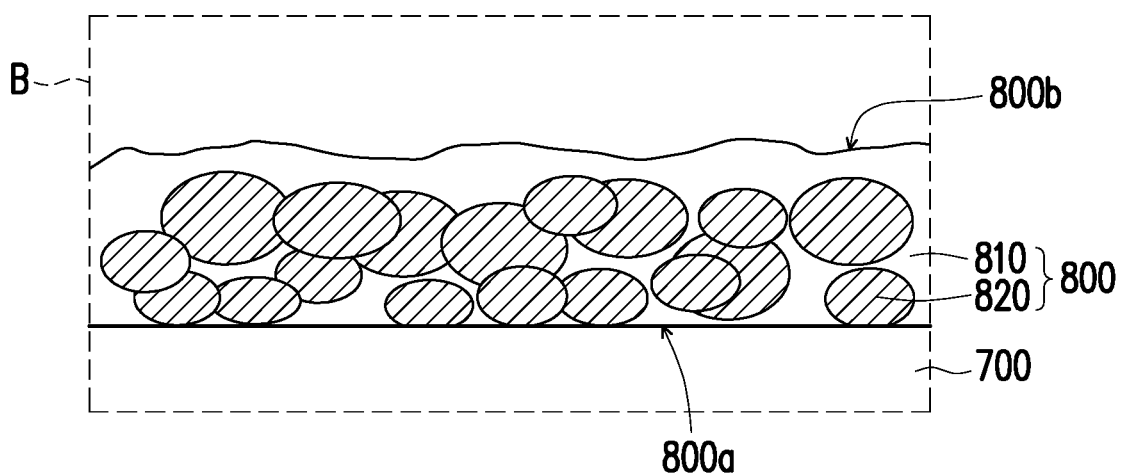
Figure 3:
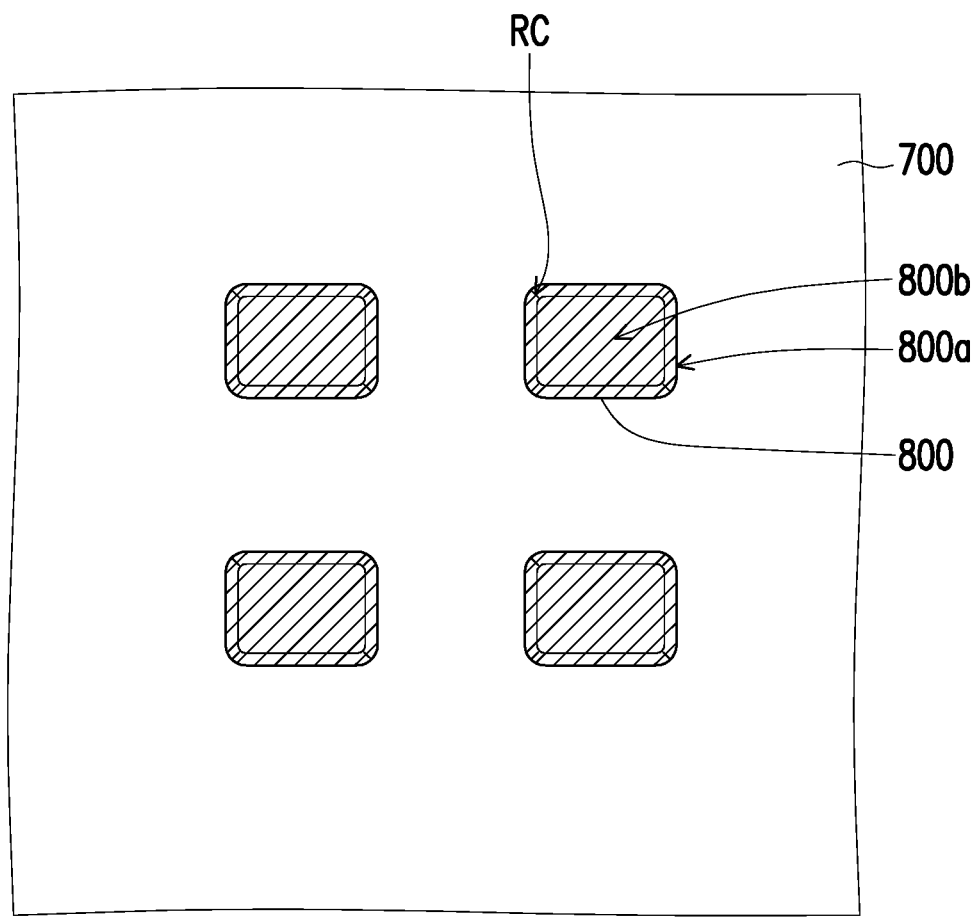
FIG. 3 is a schematic top view of FIG. 1H in accordance with some embodiments of the disclosure.

FIG. 2A and FIG. 2B are enlarged, schematic cross-sectional views of the dashed box A and the dashed box B respectively depicted in FIG. 1H according to some exemplary embodiments of the disclosure, and FIG. 3 is a schematic top view of FIG. 1H in accordance with some embodiments of the disclosure. Referring to FIG. 1H, FIG. 2A, FIG. 2B, and FIG. 3, an antenna pattern 800 is formed on the insulating layer 700 to electrically couple to the chip package 10A. In some embodiments, the antenna pattern 800 are arranged in the form of arrays on the insulating layer 700 within the intended location of the semiconductor die 300, such as the N×N array or N×M arrays (N, M>0, N may or may not be equal to M). The size of the array for the antenna pattern 800 can be designated and selected based on the demand, and is not limited to the disclosure. In certain embodiments, the antenna pattern 800 may include conductive blocks arranged in arrays, and in a top view (e.g., FIG.

3), the shapes of the conductive blocks of the antenna pattern 800 may be round, elliptical, oval, square, rectangular, tetragonal, hexagonal, octagonal, or any suitable polygonal shape. In some embodiments, the conductive blocks of the antenna pattern 800 may have rounded corners RC, and the shapes of the conductive blocks of the antenna pattern 800 in top views may be rounded polygonal shapes. In some embodiments, the antenna pattern 800 may be made from a conductive paste. For example, the conductive paste is directly applied on a top surface of the insulating layer 700 opposite to the chip package 10A and then cured so as to form the antenna pattern 800. In some embodiments, the conductive paste is applied as a series of dots at predetermined locations to form an intended pattern through a dispensing process, a coating process or a spraying process. In some embodiments, the antenna pattern 800 can be formed on the insulating layer 700 through a printing process, such as a screen printing process or a stencil printing process. For example, a patterned mask having apertures (e.g., stencil or screen; not shown) is placed over the insulating layer 700, and then the conductive paste is applied onto the insulating layer 700 through the apertures of the patterned mask. In some embodiments, a curing process is performed to cure the applied conductive paste to form the antenna pattern 800. Other suitable techniques may be utilized to form the antenna pattern 800 on the insulating layer 700.

In some embodiments, a material for forming the antenna pattern 800 includes an adhesive 810 and a conductive powder 820 mixed with the adhesive 810. The conductive powder 820 may include particles with good electrical conductivity, for example, pure metal (e.g., copper, silver, gold, etc.) particles, metal alloy (e.g., copper-silver alloy) particles, or the mixture thereof. In some embodiments, the particles of the conductive powder 820 include metallic particles. In some embodiments, the particles of the conductive powder 820 may be coated with conductive materials to exhibit improved conduction or transmission. For example, the conductive powder 820 may include silver-coated copper particles. The adhesive 810 for dispersing the conductive powder 820 may include epoxy resins, phenolic resins, or the like. In some embodiments, the material for forming the antenna pattern 800 (the antenna pattern material) further includes a small portion of volatile solvent mixed with the adhesive 810 and the conductive powder 820 to adjust the fluidity or viscosity of the conductive paste. For example, after applying the antenna pattern material (e.g., conductive paste) as a semi-fluid onto the insulating layer 700, a curing process may be performed to solidify the conductive paste. In some embodiments, during the curing process, the particles of the conductive powder 820 may be fused and aggregated or amalgamated to form fused particles with larger sizes. During the curing process, the volatile solvent in the conductive paste may be removed or dispelled. In some embodiments, conditions for curing the antenna pattern material include subjecting the antenna pattern material to a temperature of about 130° C.±10° C. for about 30 minutes. The curing conditions may be adjusted depending on the design requirements, which is not limited thereto.

In some embodiments, the conductive powder 820 contained in the antenna pattern material takes about 80% by weight to about 95% by weight. In some embodiments, the conductive powder 820 contained in the material of the antenna pattern 820 may have a weight percentage in a range of approximately 85% to 95%. The adhesive 810 in the conductive paste may have a weight percentage in a range of 5% to 15% approximately. The weight percentages of the conductive powder 820 and the adhesive 810 measured before or after the curing process may vary slightly due to the loss of the solvent. In some embodiments, the shape of the antenna pattern material may change after the curing process due to the changes of the antenna pattern material or owing to the thermal stress applied in the curing process. In some embodiments, the formed antenna pattern 800 after the curing process may have a trapezoid profile with the bottom portions larger than the upper portions. In some embodiments, the formed antenna pattern 800 may have slant sidewalls and/or rounded corners. In one embodiment, the antenna pattern 800 includes a first surface (i.e. the bottom surface) 800a contacting the insulating layer 700 and a second surface (i.e. the top surface) 800b opposite to the first surface 800a, and a surface area of the first surface 800a is greater than a surface area of the second surface 800b as shown in FIG. FIG. 2A and FIG. 3.

Continue to FIG. 1H and FIG. 2A, in some embodiments, the antenna pattern 800 further includes at least one sloping sidewall 800c connected to the first surface 800a and the second surface 800b. In some embodiments, the sloping sidewall 800c and the second surface 800b forms a rounded corner 800d at the periphery of the antenna pattern 800 indicated in the dashed box A. The radius of the rounded corner 800d may be in the range between about 0.02 μm and about 20 μm. In some embodiments, the first surface 800a and the sloping sidewall 800c forms a sidewall interior angle θ. The sidewall interior angle θ of the intersection with the sloping sidewall 800c and the first surface 800a may be an acute angle. With different conditions used in the forming processes of the antenna pattern 800, the sidewall interior angle θ may range from about 30 degrees to about 90 degrees. The dashed box B adjacent to the dashed box A may be indicated as the central portion of the antenna pattern 800. Continue to FIG. 2A and FIG. 2B, a surface roughness of the second surface 800b is greater than a surface roughness of the first surface 800a. In some embodiments, a surface roughness of the second surface 800b of the antenna pattern 800 formed by printing is greater than a surface roughness of the patterned conductive layer of the second redistribution structure 500 formed by plating or a surface roughness of the first patterned conductive layer of the first redistribution structure 100 formed by plating. The second surface 800b of the antenna pattern 800 may be rough and may not be perfectly smooth. Herein surface roughness is used to provide a measure of the surface texture (unevenness of the surface height). For example, the roughness value of the second surface 800b of the antenna pattern 800 is in the range of about 1 μm to about 5 μm. The surface roughness of the second surface 800b of the antenna pattern 800 formed by the printing process, the dispensing process, the spraying process, or the like, may be at least ten times or a hundred times greater than a surface roughness of antenna pattern formed by a plating process. It should be appreciated that the illustration of FIG. 2A and FIG. 2B are schematic and not in scale.

After forming the antenna pattern 800, the tape 70 is removed, and a singulation process may be performed to form a plurality of electronic device ED1 illustrated in FIG. 1H. In some embodiments, the electronic device ED1 may be further mounted with an additional chip package, package substrate, or other electronic devices to form a package-on-package (PoP) structure through the conductive terminals 600 and/or other additional conductive connectors based on the demand.

As mentioned above, the signal transmitted in the first redistribution structure 100 of the chip package 10A may be electrically coupled to the antenna pattern 800. The antenna pattern 800 may be referred to as patch antennas. The insulating layer 700 disposed between the chip package 10A and the antenna pattern 800 and having material properties of low Dk and low Df may be able to provide low loss transmission path, thereby allowing higher gain of the antenna. In some embodiments, the electronic device ED1 may operate in the millimeter wave range, but is not limited thereto. The antenna pattern 800 including the adhesive 810 mixing with the conductive powder 820 may be in direct contact with the insulating layer 700. Since the adhesive 810 can adhere to the insulating layer 700, an additional bonding layer between the antenna pattern 800 and the insulating layer 700 can be omitted, thereby reducing processing steps and manufacturing cost of the electronic device ED1.

Figure 4:
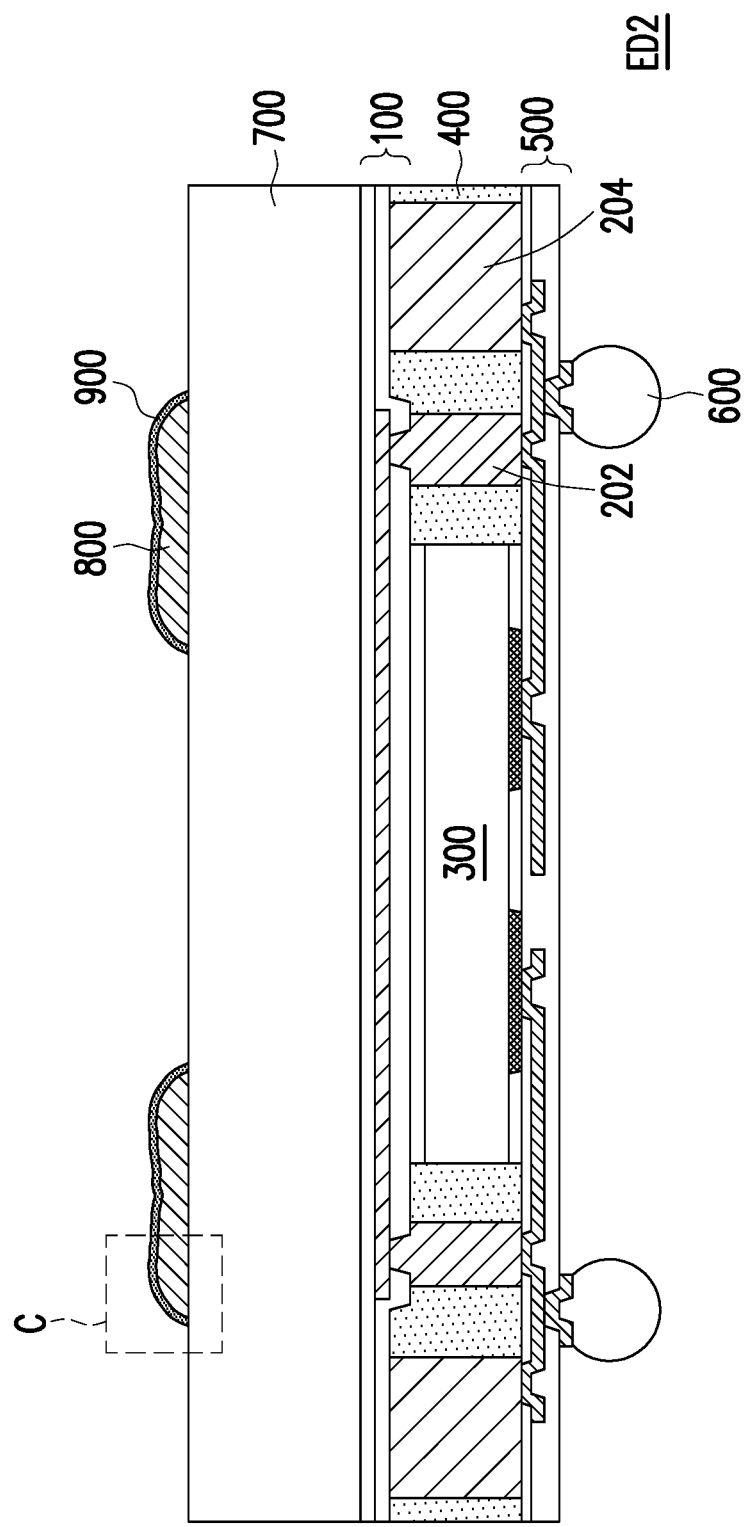
FIG. 4 is a schematic cross-sectional view of an electronic device in accordance with some embodiments of the disclosure.
Figure 5:
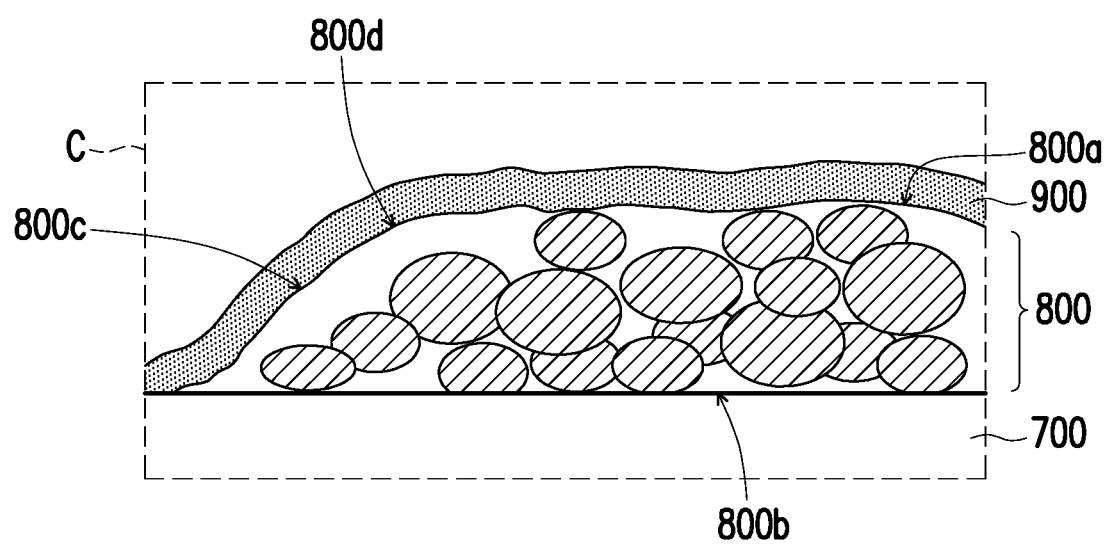
FIG. 5 is an enlarged, schematic cross-sectional view of the dashed box C depicted in FIG. 4 according to some exemplary embodiments of the disclosure.
Figure 6:
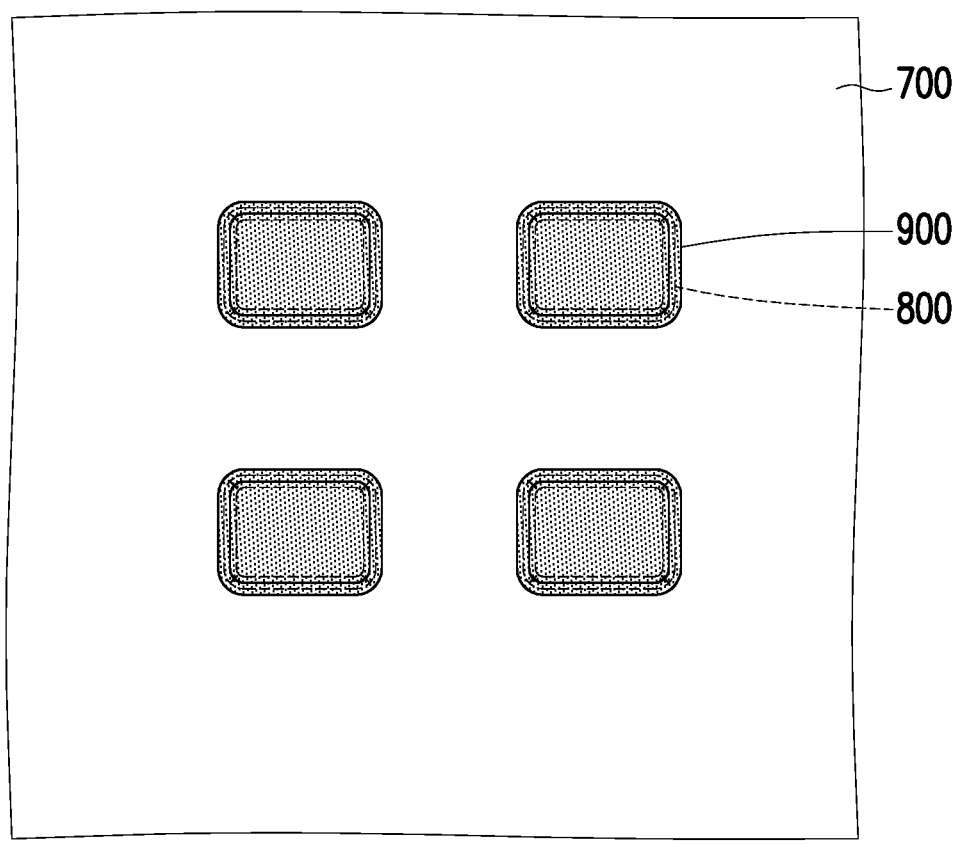
FIG. 6 is a schematic top view of FIG. 4 in accordance with some embodiments of the disclosure.

FIG. 4 is a schematic cross-sectional view of an electronic device in accordance with some embodiments of the disclosure, FIG. 5 is an enlarged, schematic cross-sectional view of the dashed box C depicted in FIG. 4 according to some exemplary embodiments of the disclosure, and FIG. 6 is a schematic top view of FIG. 4 in accordance with some embodiments of the disclosure. The electronic device ED2 shown in FIG. 4 is similar to the electronic device ED1 illustrated in FIG. 1A. The identical or similar numbers refer to the identical or similar elements throughout the drawings, and detail thereof is not repeated. Referring to FIG. 4 to FIG. 6, the electronic device ED2 further includes a protective layer 900 encapsulating the antenna pattern 800 and covering at least a portion of the insulating layer 700. For example, after forming the antenna pattern 800, the protective layer 900 is deposited on the insulating layer 700 to cover the antenna pattern 800 using a sputtering/etching process, a printing process, or other suitable techniques. For example, the material of protective layer 900 may be printed on the insulating layer 700, and the size of apertures of a patterned mask (not shown) utilized for forming the protective layer 900 may be larger than that of the patterned mask utilizing for forming the antenna pattern 800. Therefore, after printing the protective layer 900, the sloping sidewall and the second surface of the antenna pattern 800 are covered by the protective layer 900. In some embodiments, the protective layer 900 may have a surface profile substantially conformal to a surface profile of the antenna pattern 800. In other words, the protective layer 900 may have a bottom surface, a top surface, and a slanted sidewall connected to the top surface and the bottom surface as shown in FIGS. 5 and 6. In some embodiments, the protective layer 900 may include a rounded corner connected to the slanted sidewall and the top surface. In some embodiments, an outer surface of the protective layer 900 is flatter than an outer surface (covered by the protective layer 900) of the antenna pattern 800. A surface roughness of the outer surface of the antenna pattern 800 may be greater than that of the outer surface of the protective layer 900.

For example, the protective layer 900 includes conductive materials having a surface oxidation rate lower than that of the material of the antenna pattern 800. The protective layer 900 may be a single layer or may include a plurality of sublayers stacked one another. For example, the protective layer 900 includes a first sublayer connected to the second surface 800b of the antenna pattern 800, and a second sublayer stacked on the first sublayer. The first sublayer sandwiched between the antenna pattern 800 and the second sublayer may have material properties with a better wettability and a better electrical conductivity than the second sublayer. The sublayers of the protective layer 900 may include a stainless steel sublayer, a titanium sublayer (or a titanium/copper composite sublayer), or other suitable composite sublayers. In some embodiments, the first sublayer of the protective layer 900 may be made of titanium (or titanium/copper), and the second sublayer of the protective layer 900 may be made of stainless steel. In some other embodiments, the protective layer 900 may include more than two sublayers. For example, a first stainless steel sublayer may be first formed on the antenna pattern 800, and then a titanium sublayer (or a titanium/copper composite sublayer), and a second stainless steel sublayer may be sequentially stacked on the first stainless steel sublayer. The outermost stainless steel sublayer may serve as a barrier to prevent oxidation. The titanium sublayer (or titanium/copper composite sublayer) may aid a better electrical conductivity of antenna pattern 800 and a good wettability for better adhesion between layers, thereby achieving the enhanced performance of antenna. A thickness of the protective layer 900 may be adjusted depending on antenna applications at different operating frequency. For example, the antenna for 60 GHz applications, the thickness of the protective layer 900 may be in a range of about 5 μm to about 20 μm, which depends on the material being applied. In some alternative embodiments, the antenna for applications at other operating frequencies (e.g., greater than 60 GHz), the thickness of the protective layer 900 may be less than 20 μm.

Figure 7:
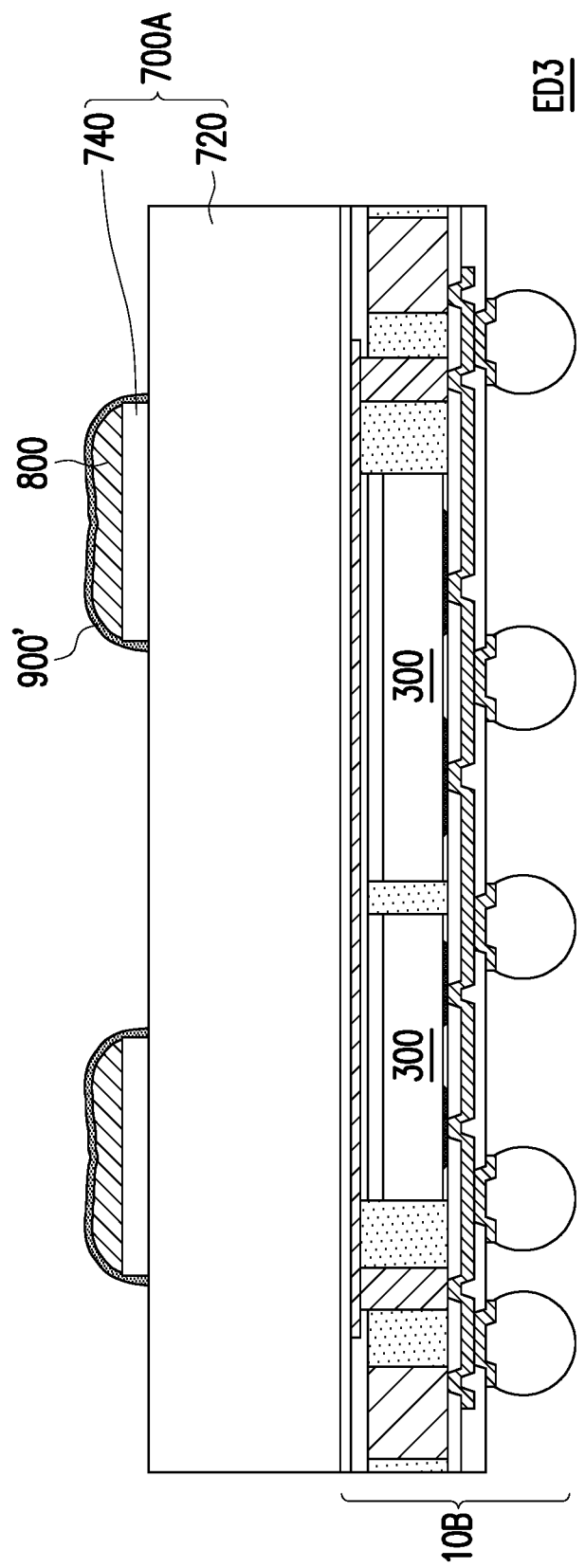
FIG. 7 is schematic cross-sectional view of an electronic device in accordance with some embodiments of the disclosure.

FIG. 7 is schematic cross-sectional view of an electronic device in accordance with some embodiments of the disclosure. Referring to FIG. 7, an electronic device ED3 includes a chip package 10B, an antenna pattern 800 electrically coupled to the chip package 10B, an insulating layer 700A disposed between the chip package 10B and the antenna pattern 800, and the protective layer 900' encapsulating the antenna pattern 800. For example, the chip package 10B includes more than one semiconductor die 300. The semiconductor dies 300 may include the same or different types of dies selected from digital dies, analog dies or mixed signal dies, application-specific integrated circuit (ASIC) dies, sensor dies, memory dies, or logic dies, or other suitable dies. For example, the semiconductor dies 300 may include at least one wireless and RF die.

The insulating layer 700A may include a first insulating sublayer 720 connected to the chip package 10B, and a second insulating pattern 740 stacked on the first insulating sublayer 720. For example, after forming the second insulating pattern 740 on the first insulating sublayer 720, portions of the first insulating sublayer 720 are exposed by the second insulating pattern 740. The antenna pattern 800 may overlap and may be attached onto the second insulating pattern 740. Materials of the first insulating sublayer 720 and the second insulating pattern 740 may be the same, and may be similar to the material of insulating layer 700 shown in FIG. 1G. In some embodiments, the second insulating pattern 740 may have a different material composition than the first insulating sublayer 720. For example, a material having lower Df and/or lower Dk may be utilized to form the second insulating pattern 740 or the first insulating sublayer 720. After forming the insulating layer 700A, the antenna pattern 800 may be formed on the second insulating pattern 740, and then the protective layer 900' is formed on the second insulating pattern 740 of the insulating layer 700A to encapsulate the antenna pattern 800.

In some embodiments, suitable materials of the protective layer 900' may be printed on the antenna pattern 800 using to form the protective layer 900' encapsulating the antenna pattern 800. For example, the size of apertures of a patterned mask (not shown) utilizing for forming the protective layer 900' may be larger than that of the size of the second insulating pattern 740. Therefore, after forming the protective layer 900', the top surface of the second insulating pattern 740 and the sidewall of the second insulating pattern 740 may be wrapped by the protective layer 900'. In some alternative embodiments, suitable materials of the protective layer 900' may be sputtered over the insulating layer 700A and the antenna pattern 800, and then etched portions of the materials of the protective layer 900' to form the protective layer 900'. Therefore, the first surface of the antenna pattern 800 is connected to the second insulating pattern 740, and the sloping sidewall and the second surface of the antenna pattern 800 are covered by the protective layer 900'. In some embodiments, portions of the materials of the protective layer 900' deposited on the sidewall of the second insulating pattern 740 may be removed during the etching step, and thus the sidewall of the second insulating pattern 740 is exposed by the protective layer 900'. In some alternative embodiments, the sidewall and at least a portion of the top surface of the second insulating pattern 740 may be exposed by the protective layer 900'.

Figure 8:
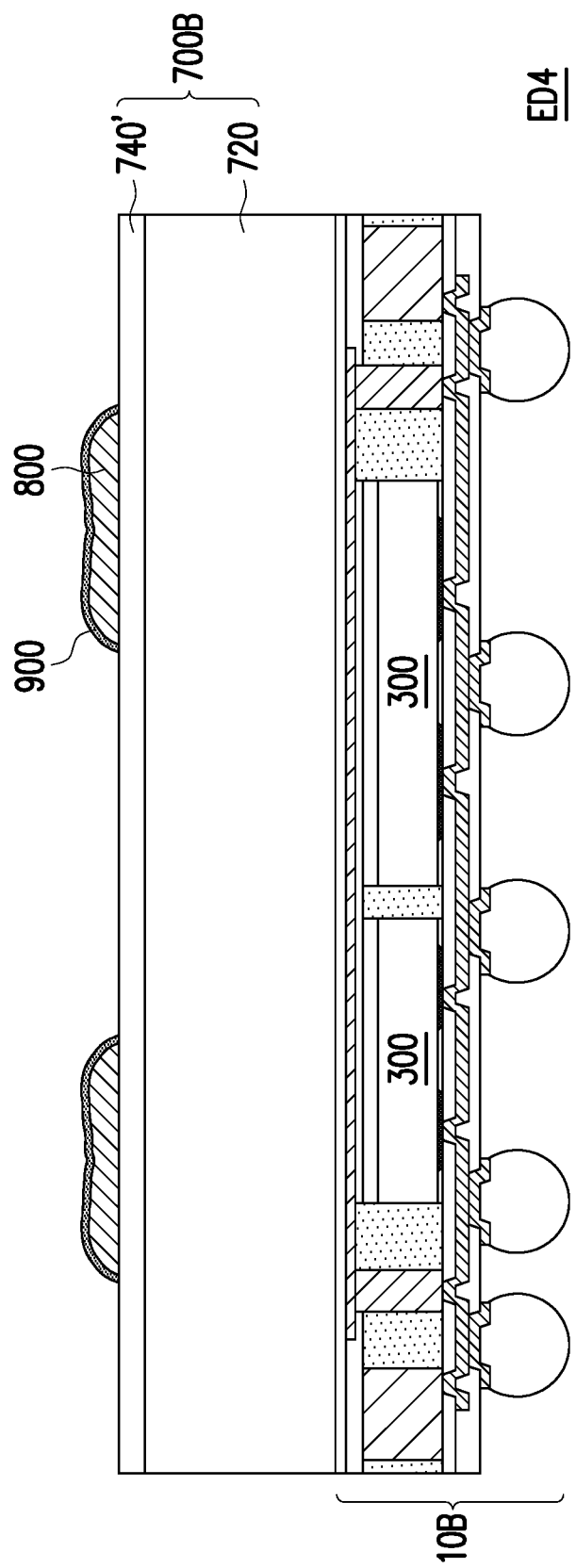
FIG. 8 is schematic cross-sectional view of an electronic device in accordance with some embodiments of the disclosure.

FIG. 8 is schematic cross-sectional view of an electronic device in accordance with some embodiments of the disclosure. Referring to FIG. 8, an electronic device ED4 is similar to the electronic device ED3 illustrated in FIG. 7. The difference lies in that an insulating layer 700B of the electronic device ED4 includes a first insulating sublayer 720 connected to the chip package 10B and a second insulating sublayer 740' stacked on the first insulating sublayer 720. The sizes of the first insulating sublayer 720 and the second insulating sublayer 740' may be substantially equal. In some embodiments, the second insulating sublayer 740' may serve as a planarization layer, and the antenna pattern 800 is disposed on the second insulating sublayer 740'. The protective layer 900 disposed on the second insulating sublayer 740' encapsulates the antenna pattern 800. The coverage area of the protective layer 900 on the top surface of the second insulating material 740' may depend on the forming process and the thickness of the protective layer 900.

Figure 9A:
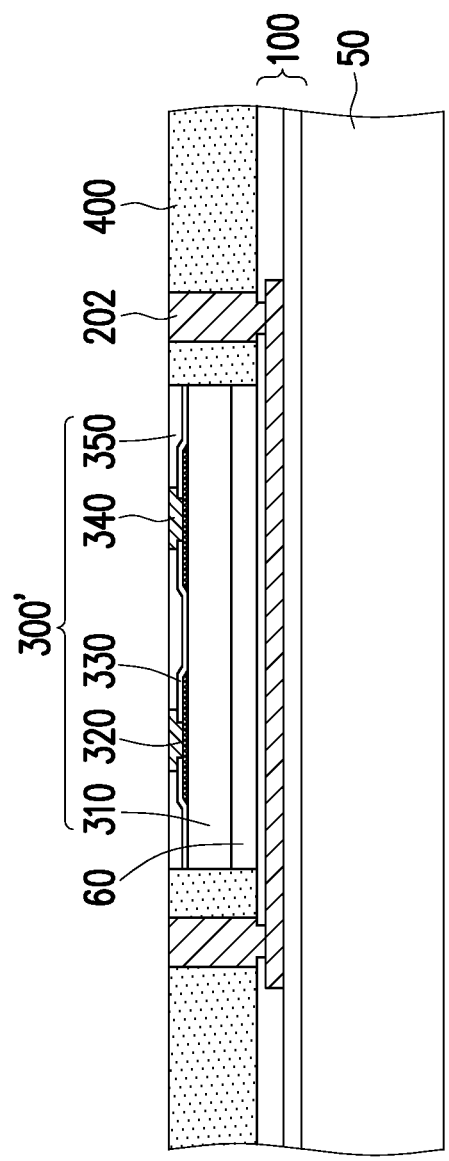
FIG. 9A and FIG. 9B are schematic cross-sectional views of various stages in a manufacturing method of a chip package in accordance with some embodiments of the disclosure.
Figure 9B:
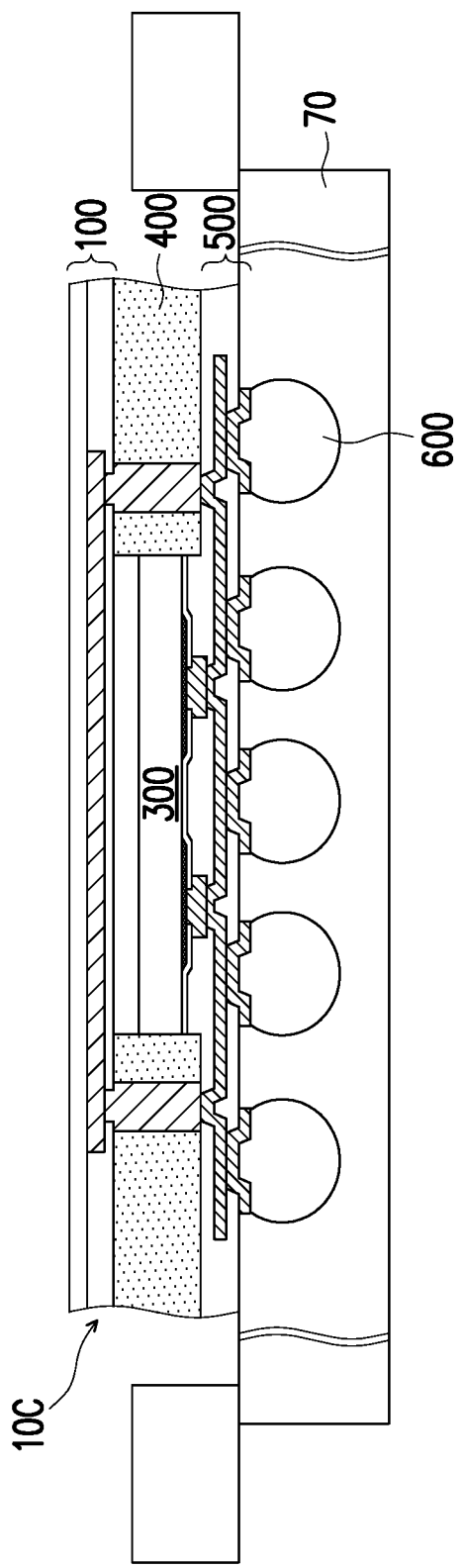

FIG. 9A and FIG. 9B are schematic cross-sectional views of various stages in a manufacturing method of a chip package in accordance with some embodiments of the disclosure, which are similar to the manufacturing method illustrated in FIG. 1A to FIG. 1F. The identical or similar numbers refer to the identical or similar elements throughout the drawings, and detail thereof is not repeated. Referring to FIG. 9A, the first redistribution structure 100 is formed on the temporary carrier 50. The first TIVs 202 are formed on the first redistribution structure 100. A semiconductor die 300' is provided and attached onto the first redistribution structure 100 through the die attach film 60. In some embodiments, the semiconductor die 300' may further include the conductive vias 340 formed in the contact openings 330a of the passivation layer 330 to be in physical contact with the conductive pads 320, and a protection layer 350 formed on the passivation layer 330 to cover the conductive vias 340.

In some embodiments, the insulating encapsulation 400 may be formed using at least the following steps. First, an encapsulation material (not shown) is over-molded on the first redistribution structure 100 so that the conductive vias 340 and the protection layer 350 of the semiconductor die 300', and the first TIVs 202 are encapsulated by the encapsulation material. In other words, the conductive vias 340 and the protection layer 350 are not revealed and are well protected by the encapsulation material. Thereafter, the encapsulation material is grinded until top surfaces of the conductive vias 340 and top surfaces of the first TIVs 202 are exposed, so as to form the insulating encapsulation 400. For example, the encapsulant material is grinded by a mechanical grinding process and/or a chemical mechanical polishing (CMP) process. In some embodiments, during the grinding process of the encapsulant material, the protection layer 350 is grinded to reveal the conductive vias 340. After grinding, the semiconductor die 300' has an active surface, and the portion of the conductive vias 340 accessibly revealed at the active surface of the semiconductor die 300'.

Referring to FIG. 9B, the second redistribution structure 500 and the conductive terminals 600 are subsequent formed on the insulating encapsulation 400 sequentially to form the chip package 10C. The chip package 10C can be overturned and disposed on the tape 70, and the temporary carrier 50 may be removed to expose the first redistribution structure 100 for further processing as illustrated in FIG. 1D to FIG. 1F. The detailed descriptions are omitted for brevity.

Figure 10C:
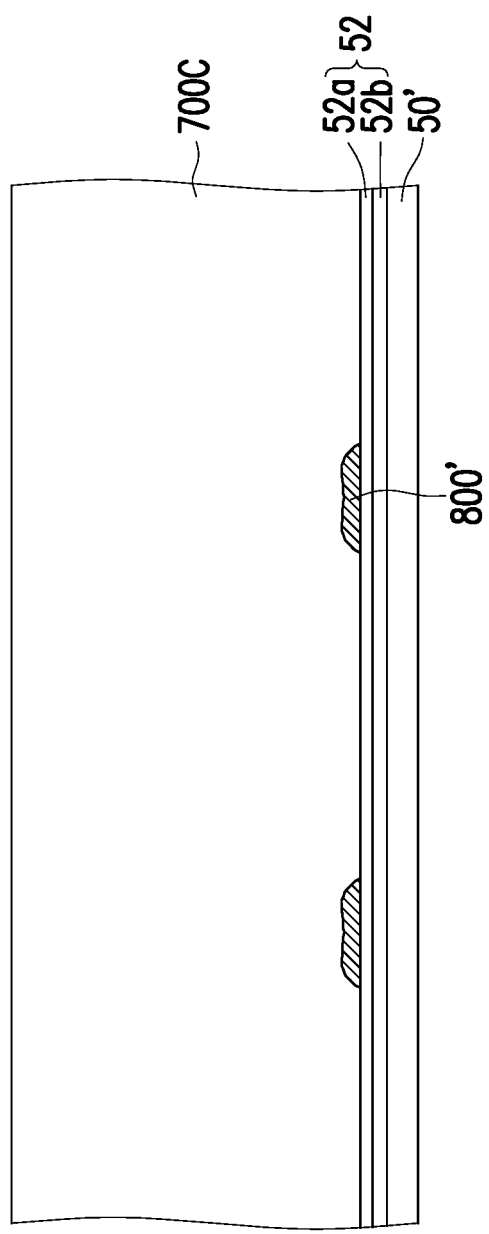

FIG. 10A to FIG. 10D are schematic cross-sectional views of various stages in a manufacturing method of an antenna pattern and a dielectric layer in accordance with some embodiments of the disclosure. In some embodiments, when performing the steps illustrated in FIG. 9A to FIG. 9B, the steps illustrated in FIG. 10A to FIG. 10D may be simultaneously conducted. Referring to FIG. 10A, a temporary carrier 50' with a de-bonding layer 52 formed thereon is provided, and then an antenna pattern 800' is formed on the de-bonding layer 52 (in FIG. 10B). The temporary carrier 50' may be similar to the temporary carrier 50 mentioned above, and the detailed descriptions are not repeated. In some embodiments, the de-bonding layer 52 may include a dielectric sublayer 52a and a release sublayer 52b. The release sublayer 52b may be in physical contact with the temporary carrier 50', and the dielectric sublayer 52a may be stacked on the release sublayer 52b. For example, the dielectric sublayer 52a may be made of a dielectric material including any suitable polymer-based dielectric material (e.g., BCB, PBO, or the like). The release sublayer 52b may be made of an epoxy-based thermal-release material, which loses its adhesive property when heated, such as a light-to-heat-conversion (LTHC) release coating film. In some alternative embodiments, the de-bonding layer 52 may include a dielectric material layer made of ultra-violet (UV) glue, which loses its adhesive property when exposed to UV lights.

Referring to FIG. 10B, the antenna pattern 800' including the adhesive 810 mixing with the conductive powder 820 may be formed and adhered on the dielectric sublayer 52a of the de-bonding layer 52 using a printing process, a dispensing process, or the like. For example, a patterned mask having apertures (e.g., stencil or screen; not shown) is placed over the de-bonding layer 52, and then the conductive paste is applied onto the de-bonding layer 52 through the apertures of the patterned mask. In some embodiments, a curing process is performed to cure the applied conductive paste to form the antenna pattern 800'. For example, the antenna pattern 800' includes the first surface (i.e. the bottom surface) 800a' connected to the de-bonding layer 52, the second surface (i.e. the top surface) 800b' opposite to the first surface 800a', and the sloping sidewall 800c' connected to the first surface 800a' and the second surface 800b'. In some alternative embodiments, the antenna pattern 800' may be formed through a plating process, sputtering and etching process, or other suitable methods depending on which kind of the material is used to form the antenna pattern 800'. In some embodiments, the antenna pattern 800' is arranged in an array form on the de-bonding layer 52. The size of the array for the antenna pattern 800' can be designated and selected based on the demand, and is not limited to the disclosure. In some embodiments, the antenna pattern 800' may be referred to as patch antennas.

Figure 10D:
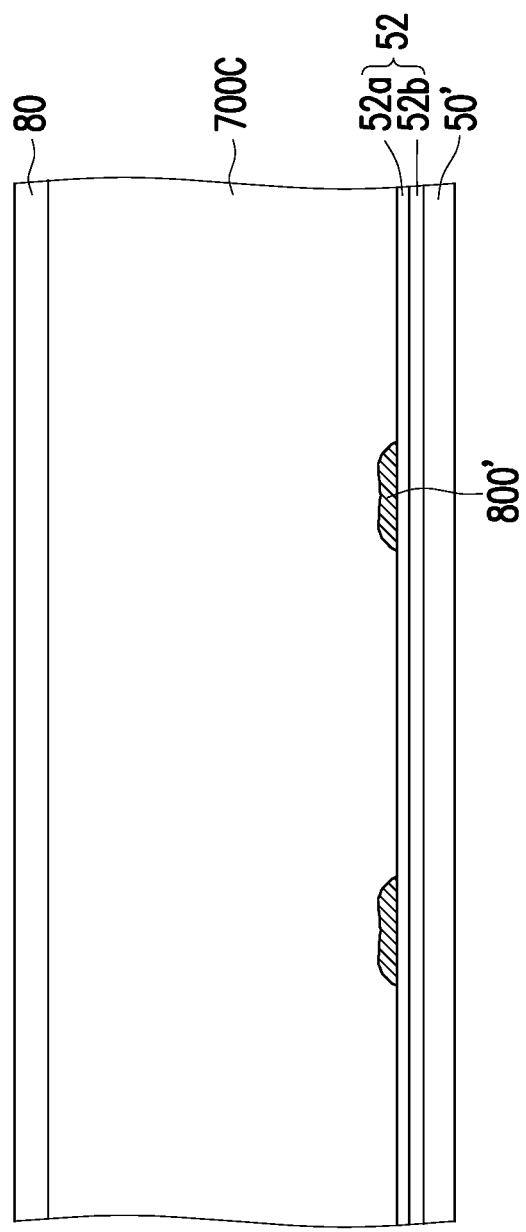

Referring to FIG. 10C and FIG. 10D, after forming the antenna pattern 800', an insulating layer 700C is formed over the de-bonding layer 52 to encapsulate the insulating layer 700C. In other words, the sloping sidewall 800c' and the second surface 800b' of the antenna pattern 800' are wrapped by the insulating layer 700C. A material of the insulating layer 700C has low dielectric constant and low loss tangent properties. In some embodiments, the insulating layer 700C is formed by a molding process. Other suitable techniques (e.g., lamination, deposition, etc.) may be utilized to form the insulating layer 700C depending on the design requirements. After forming the insulating layer 700C, an adhesive layer 80 may formed over the insulating layer 700C opposite to the de-bonding layer 52 as shown in FIG. 10D.

Figure 11:
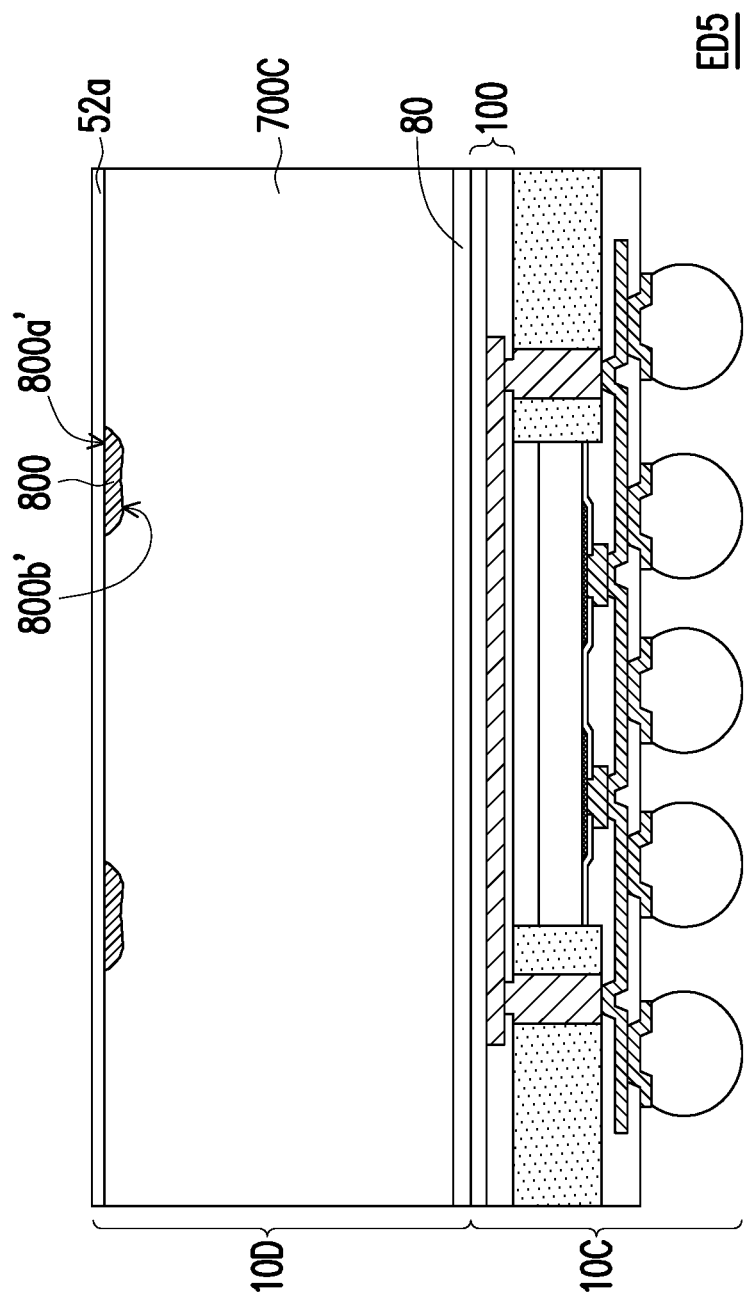
FIG. 11 is a schematic cross-sectional view of an electronic device in accordance with some embodiments of the disclosure.

FIG. 11 is a schematic cross-sectional view of an electronic device in accordance with some embodiments of the disclosure. Referring to FIG. 9B, FIG. 10D and FIG. 11, the electronic device ED5 includes the chip package 10C and an antenna package 10D stacked thereon. For example, after forming the adhesive layer 80, the structure shown in FIG. 10D can be overturned so that the antenna pattern 800' embedded in the insulating layer 700C may be attached onto the first redistribution structure 100 through the adhesive layer 80 as shown in FIG. 9B. The temporary carrier 50' may be removed through de-bonding the release sublayer 52b, and the structure remained on the chip package 10C may be collectively viewed as the antenna package 10D. The antenna pattern 800' may have the surface area of the first surface 800a' exposed by the insulating layer 700C greater than that of the second surface 800b' connected to the insulating layer 700C. In some embodiments, the dielectric sublayer 52a may be remained on the insulating layer 700C to cover the first surface 800a' of the antenna pattern 800' for preventing oxidation of the antenna pattern 800' or being damaged. In some alternative embodiments in which the antenna pattern 800' including a mixing proportion of antioxidative materials, the dielectric sublayer 52a may be removed to expose the first surface 800a' of the antenna pattern 800'. After attaching the chip package 10C and the antenna package 10D, the tape 70 is removed and a singulation process may be performed to form a plurality of the electronic device ED5. After the singulation process, a sidewall of the antenna package 10D may be substantially aligned with a sidewall of the chip package 10C on the stacking direction of the antenna package 10D and the chip package 10C.

In accordance with some embodiments, the electronic device includes a chip package, an antenna pattern, and an insulating layer. The chip package includes a semiconductor die and an insulating encapsulation enclosing the semiconductor die. The antenna pattern is electrically coupled to the chip package, where a material of the antenna pattern comprises a conductive powder having fused metal particles. The insulating layer disposed between the chip package and the antenna pattern, where the antenna pattern includes a first surface in contact with the insulating layer, and a second surface opposite to the first surface, and a surface roughness of the second surface is greater than a surface roughness of the first surface In accordance with some embodiments, a method of manufacturing an electronic device includes at least the following steps. An insulating layer is formed on a chip package. An antenna pattern is printed on the insulating layer to electrically couple to the chip package, wherein the antenna pattern includes a first surface in contact with the insulating layer, and a second surface opposite to the first surface, and a surface area of the first surface is greater than a surface area of the second surface.

In accordance with some embodiments, a method of manufacturing an electronic device includes at least the following steps. An antenna pattern is encapsulated by an insulating layer to form an antenna package, where the antenna pattern includes a first surface and a second surface opposite to the first surface, a surface area of the first surface exposed by the insulating layer is greater than a surface area of the second surface in contact with the insulating layer. The antenna package is attached to a chip package, where the insulating layer is located between the chip package and the antenna pattern.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. An electronic device, comprising:
   a chip package comprising a semiconductor die and an insulating encapsulation enclosing the semiconductor die;
   an antenna pattern electrically coupled to the chip package, wherein a material of the antenna pattern comprises a conductive powder having fused metal particles; and
   an insulating layer disposed between the chip package and the antenna pattern, wherein the antenna pattern comprises a first surface in contact with the insulating layer, and a second surface opposite to the first surface, and a surface roughness of the second surface is greater than a surface roughness of the first surface.

2. The electronic device of claim 1, wherein the antenna pattern comprises a sidewall connected to the first surface and the second surface, and a sidewall interior angle being an intersection with the sidewall and the first surface, and the sidewall interior angle is an acute angle.

3. The electronic device of claim 1, wherein an area of the first surface of the antenna pattern is greater than an area of the second surface.

4. The electronic device of claim 1, further comprising:
   a protective layer encapsulating the antenna pattern and covering at least a portion of the insulating layer.

5. The electronic device of claim 4, wherein the protective layer comprises a conductive material having a surface oxidation rate lower than that of a material of the antenna pattern.

6. The electronic device of claim 4, wherein the protective layer comprises a surface profile substantially conformal to a surface profile of the antenna pattern.

7. The electronic device of claim 4, wherein the insulating layer comprises an insulating pattern, the antenna pattern is disposed on a top surface of the insulating pattern, and the protective layer covers the top surface and a sidewall of the insulating layer.

8. The electronic device of claim 1, wherein the antenna pattern is embedded in the insulating layer, and the first surface of the antenna pattern is exposed by the insulating layer.

9. The electronic device of claim 1, wherein the antenna pattern comprises a plurality of conductive blocks arranged in an array, and each of the conductive blocks of the antenna pattern comprises a rounded corner.

* * * * *